US008830780B2

United States Patent
Jung et al.

(10) Patent No.: US 8,830,780 B2
(45) Date of Patent: Sep. 9, 2014

(54) SYSTEM AND METHOD OF PERFORMING POWER ON RESET FOR MEMORY ARRAY CIRCUITS

(71) Applicant: QUALCOMM Incorporated, San Diego, CA (US)

(72) Inventors: Changho Jung, San Diego, CA (US); Peng Jin, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/741,886

(22) Filed: Jan. 15, 2013

(65) Prior Publication Data

US 2014/0198598 A1    Jul. 17, 2014

(51) Int. Cl.
*G11C 5/14*                (2006.01)
(52) U.S. Cl.
CPC ........................................ *G11C 5/14* (2013.01)
USPC ...................... 365/226; 365/230.06
(58) Field of Classification Search
CPC ................... G11C 5/14; G11C 8/08
USPC ............................. 365/226, 230.06
See application file for complete search history.

(56) References Cited

U.S. PATENT DOCUMENTS

| | | | | |
|---|---|---|---|---|
| 5,477,176 A | * | 12/1995 | Chang et al. | 327/143 |
| 5,629,903 A | * | 5/1997 | Agata | 365/230.06 |
| 5,652,730 A | | 7/1997 | Kono et al. | |
| 5,905,690 A | * | 5/1999 | Sakurai et al. | 365/233.1 |
| 6,717,868 B2 | * | 4/2004 | Kato et al. | 365/194 |
| 7,848,170 B2 | | 12/2010 | Sugiura | |
| 2005/0024923 A1 | * | 2/2005 | Kim et al. | 365/149 |
| 2007/0180269 A1 | | 8/2007 | Irish et al. | |
| 2012/0147661 A1 | | 6/2012 | Behrends et al. | |

* cited by examiner

*Primary Examiner* — Michael Tran
(74) *Attorney, Agent, or Firm* — Arent Fox LLP

(57) ABSTRACT

The disclosure relates to an apparatus for deactivating one or more predecoded address lines of a memory circuit in response to one or more of the predecoded address lines being activated upon powering on of at least a portion of the apparatus. In particular, the apparatus includes a memory device; an address predecoder configured to activate one or more of a plurality of predecoded address lines based on an input address, wherein the plurality of predecoded address lines are coupled to the memory device for accessing one or more memory cells associated with the one or more activated predecoded address lines; and a power-on-reset circuit configured to deactivate one or more of the predecoded address lines in response to the one or more of the predecoded address lines being activated upon powering on the at least portion of the apparatus.

20 Claims, 7 Drawing Sheets

SYSTEM AND METHOD OF PERFORMING POWER ON RESET FOR MEMORY ARRAY CIRCUITS

FIELD

The present disclosure relates generally to memory circuits, and more specifically, to a system and method of performing a power on reset for a memory array circuit.

BACKGROUND

There are many types of memory circuits, such as static read access memory (SRAM), dynamic read access memory (DRAM), electrically erasable read only memory (EEPROM), flash memory, and other types of memory circuits. These memory circuits typically comprise a plurality of memory cells organized in a two-dimensional array. The memory cells are accessed by way of parallel word lines extending along one dimension (e.g., along the rows) of the memory array, and bit lines extending along an orthogonal dimension (e.g., along the columns) of the memory array. A particular memory cell is typically accessed by activating or applying a particular voltage to a word line coupled to that cell, and sensing a response from or applying another particular voltage to a bit line coupled to that cell.

Generally, an address predecoder is provided with the memory array for accessing one or more memory cells that correspond to an input binary address. More specifically, the address predecoder, via a row decoder in the memory array, activates the word line of the one or more memory cells corresponding to the input binary address. Usually, the predecoder receives the input binary address in an asynchronous manner, and activates the appropriate word line in a synchronous manner typically using a latch circuit responsive to a clock. After activating the particular word line for a defined time interval to allow access to the corresponding one or more memory cells, a reset signal is generated to reset the latch circuit and ensure that the particular word line is no longer activated.

In some cases, upon powering on such memory circuits, one or more latch circuits in the address predecoder may start up at the wrong state causing one or more word lines to be activated. The activated word lines may produce undesirable high currents in the memory array and may cause the memory circuit to operate in an abnormal manner. Thus, it would be desirable to generate a power on reset of the predecoder latches in order to prevent premature activation of word lines and prevent high currents and abnormal operations in the memory circuits.

SUMMARY

An aspect of the disclosure relates to an apparatus comprising a memory device; an address predecoder configured to activate one or more of a plurality of predecoded address lines based on an input address, wherein the plurality of predecoded address lines are coupled to the memory device for accessing one or more memory cells associated with the one or more activated predecoded address lines; and a power-on-reset circuit configured to deactivate one or more of the predecoded address lines in response to one or more predecoded address lines being activated upon powering on of at least a portion of the apparatus.

In another aspect of the disclosure, the power-on-reset circuit is configured to generate a reset signal to cause the address predecoder to deactivate the one or more activated predecoded address lines upon powering on the at least portion of the apparatus. In yet another aspect, the power-on-reset circuit is configured to initiate a generation of a reset signal to deactivate the one or more activated predecoded address lines upon powering on the at least portion of the apparatus.

In another aspect of the disclosure, the memory device comprises a plurality of memory arrays, wherein a first set of one or more of the predecoded address lines is configured for selecting one or more of the memory arrays, and wherein a second set of predecoded address lines is configured for selecting one or more word lines of the selected one or more memory arrays. In still another aspect, the power-on-reset circuit is configured to deactivate one or more of the predecoded address lines in response to one or more of the predecoded address lines of the second set being activated upon powering on of the at least portion of the apparatus, and not deactivate one or more of the predecoded address lines in response to one or more of the predecoded address lines of the first set being activated upon powering on of the at least portion of the apparatus.

In another aspect of the disclosure, the apparatus comprises a read/write cycle reset timer configured to deactivate the predecoded address lines during each read or write cycle operation performed on the memory device. In still another aspect, the power-on-reset circuit is configured to initiate the read/write cycle reset timer to deactivate one or more predecoded lines in response to the one or more of the predecoded address lines being activated upon powering on of the least portion of the apparatus.

Other aspect of the disclosure relates to apparatus, components, modules, devices, encoded computer-readable storage mediums, and other elements configured to achieve the operations in accordance with the aforementioned method. In general, other aspects, advantages and novel features of the present disclosure will become apparent from the following detailed description of the disclosure when considered in conjunction with the accompanying drawings.

The word "exemplary" is used herein to mean "serving as an example, instance, or illustration." Any aspect described herein as "exemplary" is not necessarily to be construed as preferred or advantageous over other aspects."

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Figure 1:
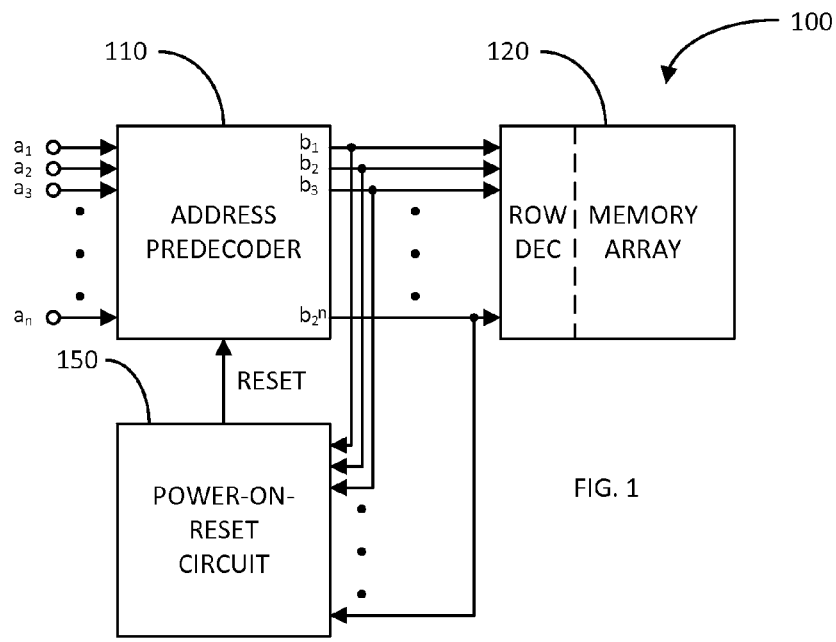
FIG. 1 illustrates a block diagram of an exemplary memory circuit in accordance with an aspect of the disclosure.

FIG. 1 illustrates a block diagram of an exemplary memory circuit 100 in accordance with an aspect of the disclosure. In summary, the memory circuit 100 includes a power-on-reset circuit configured to generate a RESET signal to deactivate one or more predecoded addresses or word lines that initially settle to an activated state upon powering on of the memory circuit. The deactivation of the one or more predecoded address or word lines prevents high currents in the memory array, and configures the memory array for normal intended operations.

In particular, the memory circuit 100 comprises an address predecoder 110, a memory array 120, and a power-on-reset circuit 150. The address predecoder 110 is configured to output a predecoded address $b_1$ to $b_2n$ based on an input binary address $a_1$ to $a_n$. More specifically, the address predecoder 110 is configured to activate (e.g., apply a defined voltage to) one of the predecoded address lines $b_1$ to $b_2n$, which corresponds to the input binary address $a_1$ to $a_n$. Generally, the address predecoder 110 receives the input binary address $a_1$ to $a_n$ in an asynchronous manner, and outputs the predecoded address $b_1$ to $b_2n$ based on a clock signal. Internally, the address predecoder 110 may comprise $2^n$ number of latch circuits for outputting the predecoded address $b_1$ to $b_2n$ in a synchronous manner in response to the clock signal.

The predecoded address lines $b_1$ to $b_2n$ are electrically coupled to the row decoder of the memory array 120 for the purpose of activating the word lines of the memory array 120. During read or write operations, the address predecoder 110 activates (e.g., applies a defined voltage to) one of the predecoded address lines $b_1$ to $b_2n$. The row decoder of the memory array 120, in turn, activates a word line corresponding to the activated predecoded address line to allow access to one or more memory cells coupled to the activated word line. After the one or more memory cells are accessed, a RESET signal is applied to the address predecoder 110, and in particular, to the latch circuit corresponding to the activated predecoded address, to deactivate (e.g., return it to ground potential) the corresponding predecoded address line.

However, as discussed in the Background section, during a power on operation of the memory circuit 100, the initial state of one or more latch circuits internal to the address predecoder 110 may be unknown. In some cases, the initial state of one or more latch circuits may be such that one or more predecoded address lines may be activated. This is generally undesirable because the activated one or more predecoded address lines may cause high currents to be generated in the memory array 120 via the corresponding one or more activated word lines, and may cause the memory array 120 to operate in an abnormal manner.

To address this issue, the power-on-reset circuit 150 is configured to generate a RESET signal to deactivate one or more predecoded address lines $b_1$ to $b_2n$ in response to the one or more predecoded address lines $b_1$ to $b_2n$ being activated upon powering on of the memory circuit 100. This ensures that all of the predecoded address lines $b_1$ to $b_2n$ will be at a deactivated state upon powering on of the memory circuit 100, and avoid the undesirable high currents and abnormal operations that may otherwise occur in the memory array 120. The following provides a detailed discussion of other exemplary embodiments that implement power-on-reset operations similar to the one implemented in the memory circuit 100.

Figure 2:
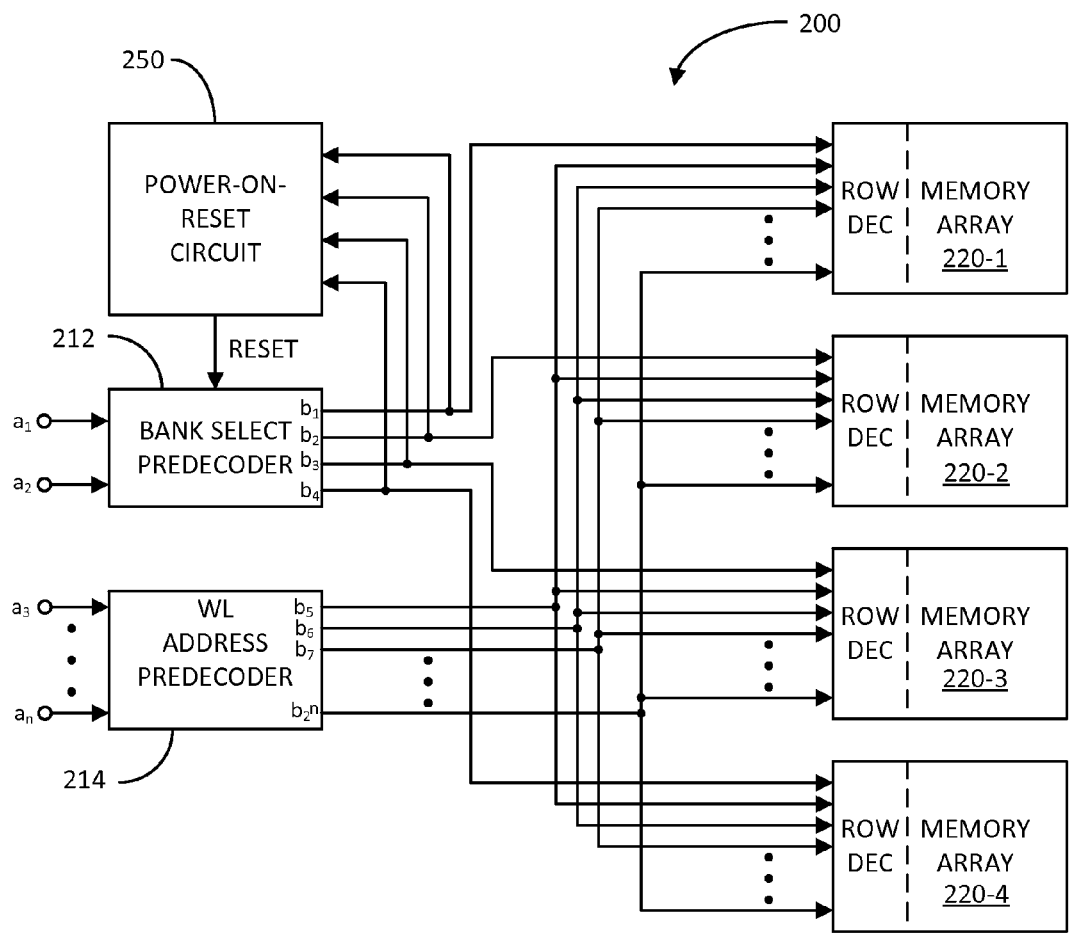
FIG. 2 illustrates a block diagram of another exemplary memory circuit in accordance with another aspect of the disclosure.

FIG. 2 illustrates a block diagram of another exemplary memory circuit 200 in accordance with another aspect of the disclosure. In summary, the memory circuit 200 is similar to that of memory circuit 100 previously discussed, except that not all of the predecoded address lines $b_1$ to $b_2n$ are used in order to generate the RESET signal to deactivate the word lines in the memory arrays. More specifically, in memory circuit 200, predecoded address lines that are used for selection of memory banks of one or more memory arrays are used to generate the RESET signal to ensure that all of the word lines in the memory arrays are deactivated. Predecoded address lines used for the selection of word lines in an array are not needed to generate a RESET to ensure that all of the word lines in the memory arrays are deactivated.

In particular, the memory circuit 200 comprises a bank select predecoder 212, a word line (WL) address predecoder 214, four (4) memory arrays 220-1 to 220-4, and a power-on-reset circuit 250. The bank select predecoder 212 receives a first portion of the input binary address $a_1$ to $a_n$, and in this example, bits $a_1$ and $a_2$ of the input binary address. The bank select predecoder 212 activates one of four predecoded address lines $b_1$ to $b_4$ based on the received first portion (e.g., bits $a_1$ and $a_2$) of the input binary address. The predecoded address lines $b_1$ to $b_4$ are used for selecting the four (4) memory arrays 220-1 to 220-4, respectively. Accordingly, the predecoded address lines $b_1$ to $b_4$ are electrically coupled to the row decoders of the memory arrays 220-1 to 220-4, respectively.

The WL address predecoder 214 receives a second portion of the input binary address $a_1$ to $a_n$, and in this example, bits $a_3$ to $a_n$ of the input binary address. The WL address predecoder 214 activates one of ($2^n$-4) predecoded address lines $b_5$ to $b_2n$ based on the received second portion (e.g., bits $a_3$ to $a_n$) of the input binary address. The predecoded address lines $b_7$ to $b_2n$ are used for selecting the word lines of the selected memory array. More specifically, the WL select predecoded address lines $b_5$ to $b_2n$ are electrically coupled to the row decoders of the memory arrays 220-1 to 220-4, respectively. The row decoders of the memory arrays 220-1 to 220-4 logically ANDed the corresponding bank select predecoded address lines $b_1$ to $b_4$ with each of the WL select predecoded address lines $b_5$ to $b_2n$ to select word lines in the memory arrays, respectively.

The power-on-reset circuit 250 includes inputs coupled to the predecoded address lines $b_1$ to $b_4$ of the bank select address predecoder 212. The power-on-reset circuit 250 is configured to generate a RESET signal to deactivate any activated predecoded address lines $b_1$ to $b_4$ of the bank select address predecoder 216 upon powering on of the memory circuit 200. Since, as discussed above, the corresponding bank select predecoded address lines $b_1$ to $b_4$ are logically ANDed with each of the WL select predecoded address lines $b_5$ to $b_2n$ to select word lines in the memory arrays, the deactivation of the bank select predecoded address lines $b_1$ to $b_4$ ensure that all of the word lines in the memory arrays 220-1 to 220-4 are deactivated, respectively. Thus, the power-on-reset circuit 250 need only receive a portion or subset of the predecoded address lines to ensure that all of the word lines in the memory arrays 220-1 to 220-4 are deactivated upon powering on of the memory circuit 200.

Figure 3:
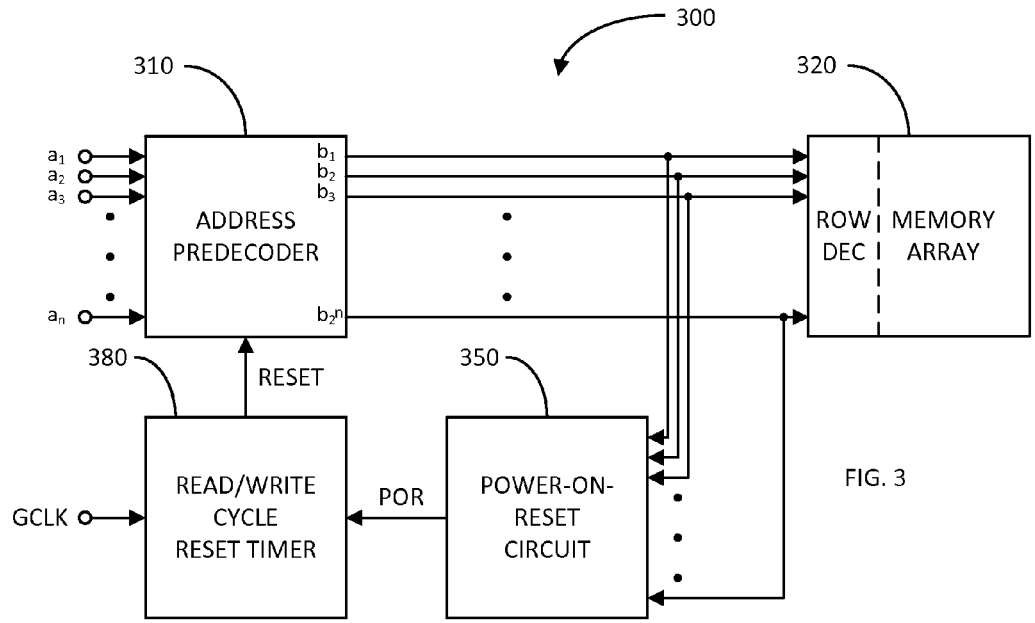
FIG. 3 illustrates a block diagram of yet another exemplary memory circuit in accordance with another aspect of the disclosure.

FIG. 3 illustrates a block diagram of yet another exemplary memory circuit 300 in accordance with another aspect of the disclosure. In summary, the memory circuit 300 uses a read/write cycle reset timer, which is configured to generate a RESET signal during each read or write cycle, to generate a RESET signal in response to one or more predecoded address lines being activated upon powering on of the memory circuit. This ensures that all of the predecoded address lines are deactivated upon powering on of the memory circuit 300. As previously discussed, this prevents high currents from being generated in a memory array and configures the memory array for normal operations during power on operations of the memory circuit 300.

In particular, the memory circuit 300 comprises an address predecoder 310, a memory array 320, a power-on-reset circuit 350, and a read/write cycle reset timer 380. As in the previous embodiments, the address predecoder 310 receives an input binary address $a_1$ to $a_n$, and generates therefrom a predecoded address $b_1$ to $b_2n$. More specifically, the address predecoder 310 activates one of the predecoded address lines $b_1$ to $b_2n$ for a unique input binary address $a_1$ to $a_n$. The predecoded address lines $b_1$ to $b_2n$ are coupled to the row decoder of the memory array 320 for the purpose of accessing one or more memory cells of the memory array 320.

The predecoded address lines $b_1$ to $b_2n$ are also coupled to respective inputs of the power-on-reset circuit 350. The power-on-reset circuit 350 is configured to generate a power-on-reset (POR) signal in response to one or more predecoded address lines $b_1$ to $b_2n$ being in an activated state upon powering on of the memory circuit 300. Again, the purpose of generating the POR signal is to deactivate any of the predecoded address lines $b_1$ to $b_2n$ during a power on operation to prevent high currents from being generated in the memory array 320 and to configure the memory array 320 for normal intended operations.

The output of the power-on-reset circuit 350 is coupled to an input of the read/write cycle reset timer 380. During normal read and write operations, the read/write cycle reset timer 380 is configured to generate a RESET signal at approximately the end of a read or write cycle. That is, during a read or write cycle, the address predecoder 310 activates one of the predecoded address lines $b_1$ to $b_2n$ based on a unique input binary address $a_1$ to $a_n$. As an example, the address predecoder 310 activates one of $2^n$ internal latch circuits to activate the corresponding one of the predecoded address lines $b_1$ to $b_2n$. After the one or more memory cells corresponding to the activated predecoded address lines are accessed during a read or write operation, the read/write cycle reset timer 380 generates or asserts the RESET signal to reset the corresponding latch circuit and deactivate the corresponding predecoded address line. From a timing perspective, the RESET signal is generated in response to a global clock signal (GCLK), which defines the time interval for accessing the one or more memory cells during a read/write cycle.

The memory circuit 300 utilizes the read/write cycle reset timer 380 to also generate a RESET signal in response to one or more of the predecoded address lines $b_1$ to $b_2n$ being in an activated state upon powering on of the memory circuit 300. As previously discussed, the power-on-reset circuit 350 generates the POR signal in response to one or more of the predecoded address lines $b_1$ to $b_2n$ being in an activated state upon powering on of the memory circuit 300. In response to the POR signal, the read/write cycle reset timer 380 generates the RESET signal to deactivate any one or more activated predecoded address lines $b_1$ to $b_2n$ to configure the memory circuit 300 for normal intended operations.

Figure 4:
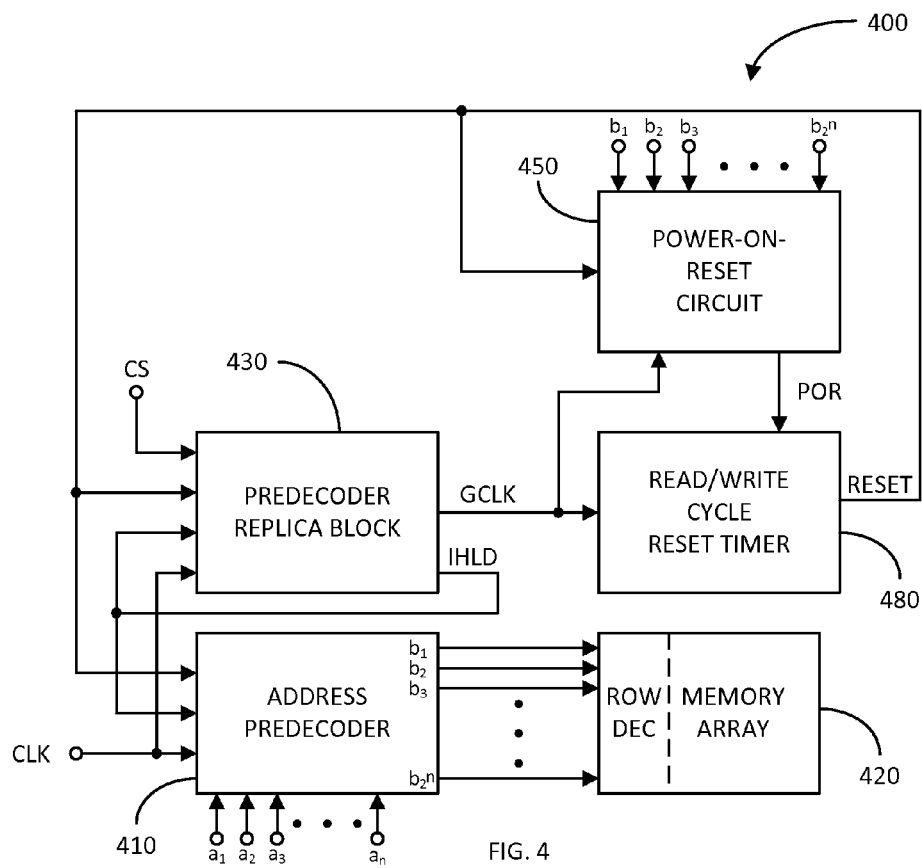
FIG. 4 illustrates a block diagram of still another exemplary memory circuit in accordance with another aspect of the disclosure.

FIG. 4 illustrates a block diagram of still another exemplary memory circuit 400 in accordance with another aspect of the disclosure. In summary, the memory circuit 400 is an example of a more detailed implementation of the memory circuit 300 previously discussed. In particular, the memory circuit 400 comprises an address predecoder 410, a memory array 420, a predecoder replica block 430, a read/write cycle reset timer 480, and a power-on-reset circuit 450.

As in the previous embodiments, the address predecoder 410 receives an input binary address $a_1$ to $a_n$, and generates therefrom a predecoded address $b_1$ to $b_2n$. More specifically, the address predecoder 410 activates one of the predecoded address $b_1$ to $b_2n$ for a unique input binary address $a_1$ to $a_n$. The predecoded address lines $b_1$ to $b_2n$ are coupled to the row decoder of the memory array 420 for the purpose of accessing one or more memory cells of the memory array 420. From a timing perspective, at approximately a beginning of a read or write cycle, the address predecoder 410 activates the predecoded address line corresponding to the input binary address $a_1$ to $a_n$ in response to a clock signal (CLK) and an input address hold (IHLD) signal. Approximately at the end of the read or write cycle, the address predecoder 410 deactivates the previously-activated predecoded address line in response to a RESET signal generated by the read/write cycle reset timer 480.

The address predecoder 410 also deactivates any activated predecoded address lines that may be in an activated state upon powering on the memory circuit 400 in response to the RESET signal generated by the read/write cycle reset timer 480. More specifically, during a power on operation, the power-on-reset circuit 450 monitors the predecoded address lines $b_1$ to $b_2n$ from the address predecoder 410. In response to one or more of the predecoded address lines $b_1$ to $b_2n$ being activated during power on operation and a global clock (GCLK) signal being in an inactivated state (e.g., a low logic state), the power-on-circuit 450 generates a power-on-reset (POR) signal. In response to the POR signal, the read/write cycle reset time 480 generates the RESET signal, which causes the address predecoder 410 to deactivate any activated predecoded address lines $b_1$ to $b_2n$ to configure the memory circuit 400 for normal intended operations.

Alternatively, during power on operation, the read/write cycle reset timer 480 may generate the RESET signal in response to the GCLK being in an activated state (e.g., a high logic state). Thus, the read/write cycle reset timer 480 generates the RESET signal during power on operation in response to: (1) the GCLK signal being in an activated state (e.g., a high logic state) irrespective of any of the predecoded address lines being activated; or (2) the POR signal being activated due to one or more of the predecoded address lines $b_1$ to $b_2n$ being activated and the GCLK signal being in an inactivated state (e.g., a low logic state).

The RESET signal is also applied to the power-on-reset circuit 450. The RESET signal deactivates an activated POR signal during a power on operation. The RESET signal is also applied to the predecoder replica block 430 for normal read/write cycle operations. More specifically, the predecoder replica block 430 generates the GCLK signal, which defines the time interval for accessing the one or more memory cells of the memory array 420. The RESET signal causes the GCLK signal to be deactivated at approximately an end of a read/write cycle, thereby completing the access of the one or more memory cells. The discussion of the operation of the memory circuit 400 including the various signals follows with reference to FIGS. 5-11.

Figure 5:
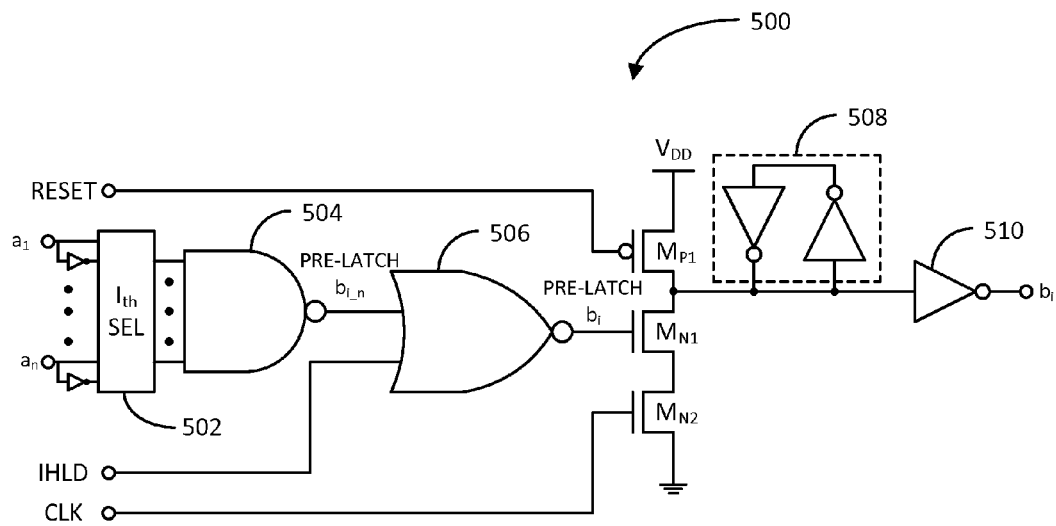
FIG. 5 illustrates a schematic diagram of an exemplary $i_{th}$-bit predecoder of the exemplary address predecoder in accordance with another aspect of the disclosure.

FIG. 5 illustrates a schematic diagram of exemplary $i_{th}$-bit predecoder circuit 500 of the address predecoder 410 in accordance with another aspect of the disclosure. As the name suggests, $i_{th}$-bit predecoder circuit 500 activates the $i_{th}$ predecoded address line $b_i$ based on a unique input binary address $a_1$ to $a_n$. It shall be understood that the address predecoder 410 includes an additional $2^n-1$ predecoder circuits similar to predecoder circuit 500 for activating the remaining predecoded address lines.

In particular, the $i_{th}$-bit predecoder circuit 500 comprises an $i_{th}$ select circuit 502, a NAND gate 504, a NOR gate 506, a p-channel field effect transistor (FET) $M_{P1}$, n-channel FETs $M_{N1}$ and $M_{N2}$, a latch circuit 508, and an inverter 510. The $i_{th}$ select circuit 502 in combination with the NAND gate 504 is configured to output an asserted pre-latch predecoded address bit $b_{i\_n}$ in an inverted logic format based on a unique input binary address $a_1$ to $a_n$. The NOR gate 506 serves to gate the pre-latch predecoded bit $b_i$ in a non-inverted logic format when the IHLD signal is in a low logic state. The asserted pre-latch predecoded bit $b_i$ at the output of the NOR gate 506 (and at the gate of FET $M_{N1}$) causes the FET $M_{N1}$ to conduct. The CLK signal is applied to the gate of NFET $M_{N2}$. Accordingly, when the CLK signal transitions to a high logic state at a beginning of a read/write cycle, the FET $M_{N2}$ also conducts.

Accordingly, when the pre-latch predecoded $i_{th}$ bit is asserted and the CLK signal is at a high logic level, both FETs $M_{N1}$ and $M_{N2}$ conduct, causing ground potential to be applied to the latch 508. This causes the latch 508 to change state and output a low logic signal at the input of the inverter 510. During this time, the RESET signal is in a non-asserted high logic state. The RESET signal being in the high logic state keeps FET $M_{P1}$ off to prevent a short circuit between $V_{DD}$ and ground. The low logic signal at the input of the inverter 510 causes the inverter 510 to generate the asserted post-latch predecoded address bit $b_i$. As previously discussed, the asserted post-latch predecoded address bit $b_i$ is used to access one or more memory cells common to a word line associated with the predecoded address bit $b_i$.

After the predecoded address bit $b_i$ is asserted, the IHLD signal is brought to a high logic state in order to decouple the asserted pre-latch predecoded bit $b_i$ from the gate of FET $M_{N1}$. This causes FET $M_{N1}$ to turn off, and prevents a short circuit between $V_{DD}$ and ground when the RESET signal is subsequently asserted. After the IHLD signal transitions to the high logic state, the RESET signal is asserted (e.g., brought to a low logic state in an inverted logic format). The asserted RESET signal causes FET $M_{P1}$ to conduct, thereby applying $V_{DD}$ to the latch 508. In response, the latch 508 changes state again and produces a high logic signal at the input of the inverter 510. The inverter 510 consequently generates a low logic signal, thereby de-asserting the predecoded address line $b_i$. After the predecoded address line bi is de-asserted, the CLK signal transitions to a low logic state to turn off FET $M_{N2}$ and the IHLD signal transitions to a low logic state to enable the NOR gate 506 for the next read/write cycle. The timing of these operations is discussed later herein with reference to timing diagrams depicted in FIGS. 9-11.

Figure 6:
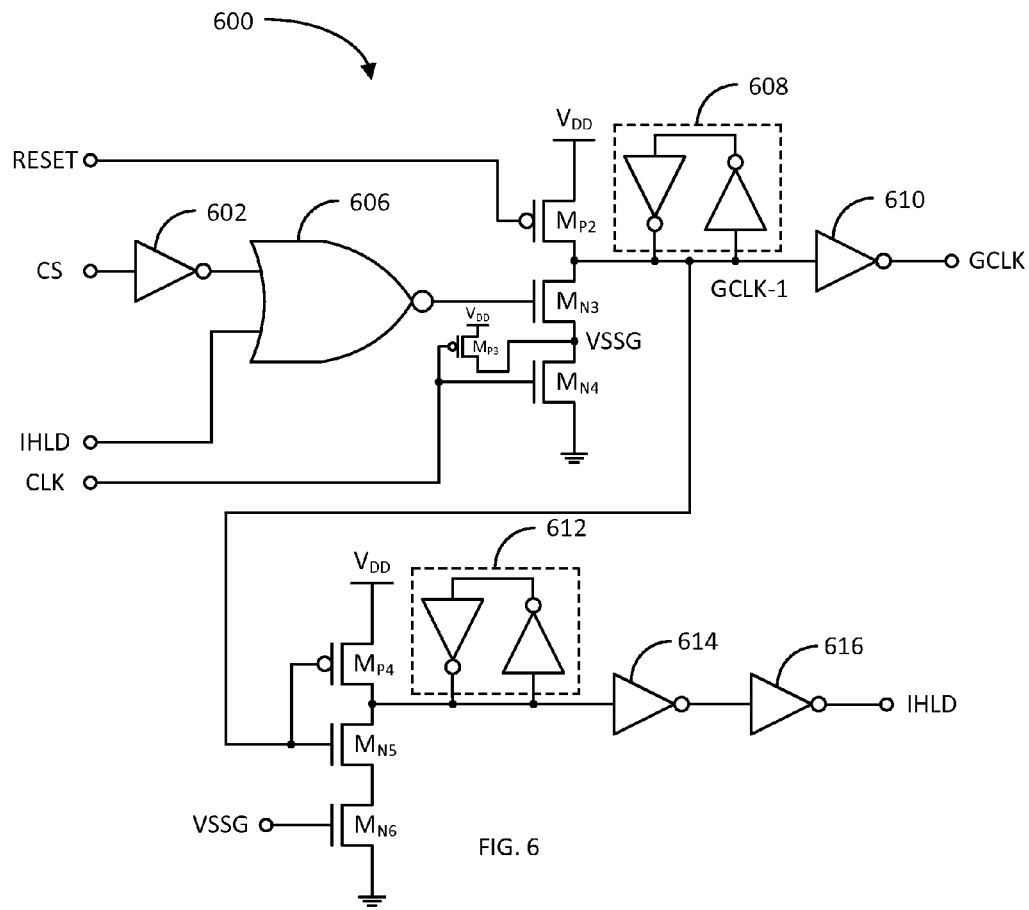
FIG. 6 illustrates a schematic diagram of an exemplary address predecoder replica block in accordance with another aspect of the disclosure.

FIG. 6 illustrates a schematic diagram of an exemplary predecoder replica block 600 in accordance with another aspect of the disclosure. The predecoder replica block 600 may be an exemplary detailed implementation of the predecoder replica block 430 previously discussed. In summary, the predecoder replica block 600 is configured to generate the GCLK and IHLD signals in response to the chip select (CS) signal and the CLK signal. The CS signal is received to initiate a read or write operation of the memory array 420. As previously discussed, the GCLK signal dictates the time interval in which the predecoded address line $b_i$ is activated for accessing one or more memory cells of the memory array 420. Also, as previously discussed, the IHLD signal selectively couples the pre-latch predecoded address bit to the latch circuit 508 in the predecoder circuit 500. Additionally, the IHLD signal selectively couples the CS signal to a similar latch circuit 608 in the predecoder replica block 600.

In particular, the predecoder replica block 600 comprises inverters 602, 610, 614, and 616, a NOR gate 606, p-channel FETs $M_{P2}$, $M_{P3}$, and $M_{P4}$, n-channel FETs $M_{N3}$, $M_{N4}$, $M_{N5}$, and $M_{N6}$, and latches 608 and 612. The inverter 602 includes an input configured to receive the CS signal. As previously discussed, the CS signal initiates a read or write operation by being asserted (e.g., transitioning to a high logic level). The inverter 602 inverts the high logic level to generate a low logic level at an input of the NOR gate 606. When the IHLD signal is at a low logic level, the NOR gate 606 gates the asserted CS signal to the gate of FET $M_{N3}$, thereby causing FET $M_{N3}$ to conduct. When the CLK signal transitions from a low logic level to a high logic level, FET $M_{N4}$ is turned on, thereby causing the voltage VSSG to decrease to ground potential. When both FETs $M_{N3}$ and $M_{N4}$ are conducting, ground potential is applied to the latch 608, thereby causing the latch 608 to output a GCLK-1 signal at a low logic state. The inverter 610 inverts the low logic state to generate GCLK at a high logic state. As previously discussed, the high logic state of GCLK initiates the generation of the RESET signal by the read/write cycle reset timer 480 a defined interval later to allow access of the corresponding one or more memory cells.

The low logic levels of both VSSG and GCLK-1 cause the latch 612 to be reset or armed, and produce a high logic level at the input of inverter 614. The cascaded inverters 614 and 616 cause the IHLD signal at the output of inverter 616 to also be at the high logic level. The IHLD signal being at the high logic level causes the NOR gate 606 to decouple the asserted CS signal from the gate of FET $M_{N3}$. This causes FET $M_{N3}$ to not conduct to prevent a short circuit between $V_{DD}$ and ground from occurring when the RESET signal is subsequently asserted and turns on FET $M_{P2}$. As previously discussed, the IHLD signal has a similar effect in the predecoder circuit 500.

As previously discussed, the GCLK signal transitioning to a high logic level triggers the read/write cycle reset timer 480 to generate or assert the RESET signal a defined time interval later. The asserted RESET signal, being at a low logic level, causes FET $M_{P2}$ to conduct. This causes $V_{DD}$ to be applied to the latch 608, thereby resetting or arming the latch 608 and causing it to generate GCLK-1 at a high logic level. The inverter 610 inverts the high logic level to cause the GCLK to return to a low logic level for the next read/write cycle.

The high logic state of GCLK-1 is applied to the gates of $M_{P4}$ and $M_{N5}$. This causes FET $M_{P4}$ to not conduct and enables FET $M_{N5}$ to conduct when VSSG subsequently transitions to a high logic state and turns on FET $M_{N6}$. At an end of a read/write cycle, the CLK signal transitions back to a low logic level. This turns off FET $M_{N4}$ and turns on FET $M_{P3}$. The turning on of FET $M_{P3}$ causes VSSG to transition to a high logic state. Since VSSG is applied to the gate of FET $M_{N6}$, this causes FET $M_{N6}$ to conduct and apply a low logic level to the latch 612 by way of FET $M_{N5}$. By way of the cascaded inverters 614 and 616, the IHLD signal is brought to a low logic level to enable the NOR gate 606 (as well as the NOR gate 506 of the predecoder circuit 500) for the next read/write cycle.

Figure 7:
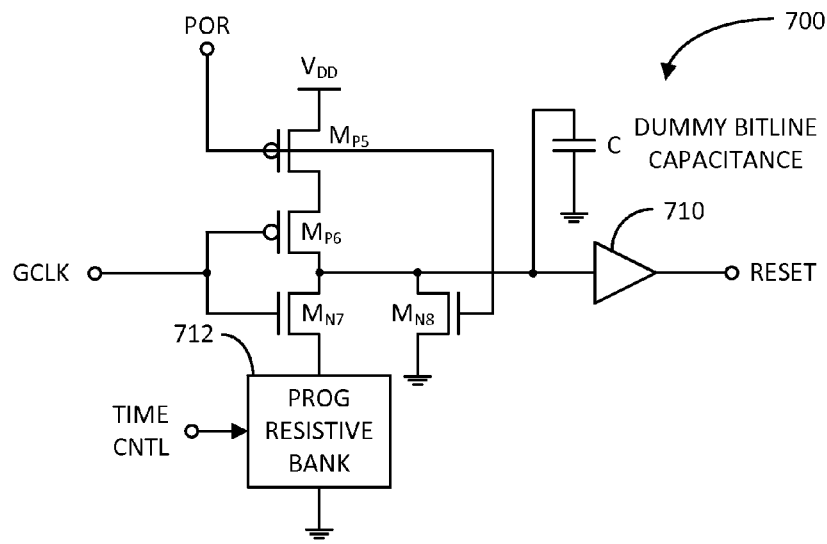
FIG. 7 illustrates a schematic diagram of an exemplary read/write cycle reset timer in accordance with another aspect of the disclosure.

FIG. 7 illustrates a schematic diagram of an exemplary read/write cycle reset timer 700 in accordance with another aspect of the disclosure. The read/write cycle reset timer 700 may be an exemplary detailed implementation of the read/write cycle reset timer 480 previously discussed. In summary, the read/write cycle reset timer 700 is configured to generate or assert a RESET signal in response to a GCLK signal or a POR signal in order to deactivate the predecoded address bit lines of the address predecoder 410.

In some cases, the read/write cycle reset timer 700 generates the RESET signal during a read/write cycle to configure the address predecoder 410 for the next read/write cycle (e.g., as discussed, deactivate the predecoded address bit lines of the address predecoder 410). In such cases, the RESET signal is generated in response to the GCLK signal transitioning to a high logic level.

In other cases, the read/write cycle reset timer 700 generates the RESET signal upon powering on of the memory circuits 400 in order to deactivate any activated predecoded address bit lines of the address predecoder 410, so as to prevent high currents from being generated in the memory array 420, and to configure the memory array 420 for normal intended operations. In such cases, the read/write cycle reset timer 700 generates the RESET signal in response to the POR signal being generated or asserted by the power-on-reset circuit 450 (e.g., the POR signal transitioning to a high logic level).

In particular, the read/write cycle reset timer 700 comprises a programmable resistive bank 712, p-channel FETs $M_{P5}$ and $M_{P6}$, n-channel FETs $M_{N7}$ and $M_{N8}$, capacitor C, and buffer 710. The GCLK signal is applied to the gates of FETs $M_{P6}$ and $M_{N7}$. The POR signal is applied to the gates of FETs $M_{P5}$ and $M_{N8}$. The programmable resistive bank 712 is coupled between the source of FET $M_{N7}$ and ground, and is configured to receive a time control signal for controlling the delay in generating the RESET signal in response to the GCLK signal transitioning to a high logic state. The FETs $M_{P5}$, $M_{P6}$, and $M_{N7}$ are coupled in series with the programmable resistive bank 712 between $V_{DD}$ and ground. The FET $M_{N8}$ and capacitor C are coupled in parallel between the drains of FETs $M_{P6}$ and $M_{N7}$ and ground. The input to the buffer 710 is coupled to the drains of FETs $M_{P6}$ and $M_{N7}$. The buffer 710 is configured to output the RESET signal.

In operation, at or before the beginning of a read/write cycle, the GCLK signal is at a low logic level and the RESET signal is at a de-asserted high logic level. During read/write cycle operations, the POR signal remains at a low logic level. Accordingly, at this time, FETs $M_{P5}$ and $M_{P6}$ are conducting, and FETs $M_{N7}$ and $M_{N8}$ are not conducting. Thus, the input to the buffer 710 is at a high logic state. When the GCLK signal transitions to a high logic level at approximately a beginning of a read/write cycle, the high logic level causes FET $M_{P6}$ to not conduct and FET $M_{N7}$ to conduct. This produces a discharging path between the input of the buffer 710 and ground. At a defined time interval later based on an RC time constant associated with the capacitor C and the resistance of the programmable resistive bank 712, the input to the buffer 710 reaches a low logic level, thereby causing the buffer 710 to output the asserted low logic level RESET signal. The capacitance of the capacitor C is based on the number of memory cells coupled to a bit line in the memory array, and in particular, simulates the effective capacitance of those memory cells. This is done to better match the timing of the RESET signal with the particular memory array being driven by the address predecoder 410.

The asserted RESET signal deactivates the predecoded address line that was activated for the current read/write cycle. This configures the address predecoder 410 for the next read/write cycle. Through the predecoder replica block 430 or 600, the asserted RESET signal causes the GCLK signal to transition back to the low logic level. The low logic level of the GCLK signal causes FETs $M_{P6}$ to conduct and FET $M_{P7}$ to not conduct to apply a high logic level signal to the input of the buffer 710. In response, the buffer 710 outputs a de-asserted high logic level RESET signal for the next read/write cycle.

With regard to power on reset, if the GCLK signal is at a low logic level upon powering on of the memory circuit 400, and one or more of the predecoded address lines $b_1$ to $b_2n$ are asserted, the power-on-reset circuit 450 generates or asserts the POR signal by bringing it to a high logic level. The high logic level of the POR signal causes FET $M_{N8}$ to conduct and FET $M_{P5}$ to not conduct. This causes the voltage at the input of the buffer 710 to be at ground potential or a low logic level. Consequently, the buffer 710 generates or asserts the RESET signal by bringing it to a low logic level. The RESET signal deactivates any predecoded address lines that were activated upon powering on of the memory circuit 400. Again, this prevents the generation of high currents in the memory array 420 and configures the memory array 420 for normal intended operations.

Figure 8:
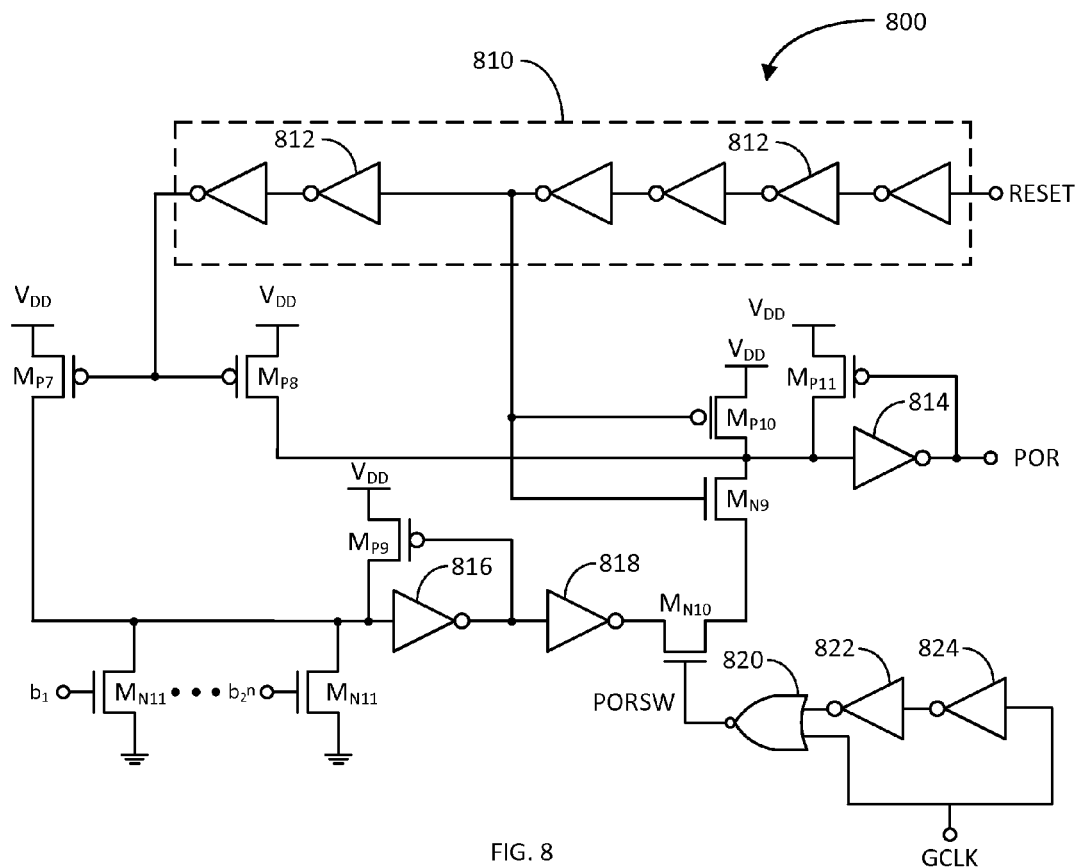
FIG. 8 illustrates a schematic diagram of an exemplary power-on-reset circuit in accordance with another aspect of the disclosure.

FIG. 8 illustrates a schematic diagram of an exemplary power-on-reset circuit 800 in accordance with another aspect of the disclosure. The power-on-reset circuit 800 may be an exemplary detailed implementation of the power-on-reset circuit 450 previously discussed. In summary, the power-on-reset circuit 800 is configured to generate or assert the POR signal upon powering on of the memory circuit 400 in response to the GCLK signal being at a low logic level (or the PORSW signal being at a high logic level) and one or more of the predecoded address lines $b_1$ to $b_2n$ being activated. As previously discussed with reference to FIG. 2, the power-on-reset circuit 450 or 800 need not monitor all of the predecoded address lines, instead it can just monitor the predecoded address lines that operate as bank select lines. The asserted POR signal, in turn, causes the read/write cycle reset timer 480 or 700 to generate or assert the RESET signal to deactivate any activated predecoded address lines $b_1$ to $b_2n$. During read/write cycle operations, the power-on-reset circuit 800 maintains the POR signal at the de-asserted low logic level to prevent interference with the read/write operations of the read/write cycle reset timer 480 or 700.

In particular, the power-on-reset circuit 800 comprises a delay circuit 810 including a plurality of cascaded inverters 812, p-channel FETs $M_{P7}$, $M_{P8}$, $M_{P9}$, $M_{P10}$, and $M_{P11}$, n-channel FETs $M_{N9}$ and $M_{N10}$, and a plurality of n-channel FETs $M_{N11}$ having gates coupled to the predecoded address lines $b_1$ to $b_2n$, respectively. Additionally, the power-on-reset circuit 800 further comprises inverters 814, 816, 818, 822 and 824, and a NOR gate 820. The input to the delay circuit 810 is configured to receive the RESET signal generated by the read/write cycle reset timer 480 or 700. An intermediate node of the delay circuit 810, at an output of an even number (e.g., four (4)) of inverters 812 from the input, is coupled to the gates of FETs $M_{P10}$ and $M_{N9}$. The output of the delay circuit 810 is coupled to the gates of FETs $M_{P7}$ and $M_{P8}$.

The source and drain of FET $M_{P7}$ is coupled between $V_{DD}$ and the drains of the plurality of FETs $M_{N11}$. The source and drain of FET $M_{P8}$ is coupled between $V_{DD}$ and the drains of FETs $M_{P10}$, $M_{P11}$, and $M_{N9}$, and to the input of inverter 814. The sources of FETs $M_{P10}$ and $M_{P11}$ are coupled to $V_{DD}$. The output of the inverter 814 is coupled to the gate of FET $M_{P11}$, and is configured to generate or assert the POR signal. The source of FET $M_{N9}$ is coupled to the drain of FET $M_{N10}$. The source and drain of FET $M_{P9}$ is coupled between $V_{DD}$ and the drains of the plurality of FETs $M_{N11}$. The drains and sources of the plurality of FETs $M_{N11}$ are coupled between the input of the inverter 816 and ground. The predecoded address lines $b_1$ to $b_2n$ are coupled to the gates of the plurality of FETs $M_{N11}$, respectively.

The output of inverter 816 is coupled to the gate of FET $M_{P9}$ and to the input of inverter 818. The output of inverter 818 is coupled to the source of FET $M_{N10}$. The input of inverter 824 and an input of the NOR gate 820 are configured to receive the GCLK signal. The output of inverter 824 is coupled to the input of inverter 822. The output of inverter 822 is coupled to the other input of the NOR gate 820. The output of the NOR gate 820, which is coupled to the gate of FET $M_{N10}$, is configured to generate the PORSW signal.

In operation, if the GCLK signal initially settles to a low logic level state upon powering on of the memory circuit 400, the circuit comprising the NOR gate 820 and inverters 822 and 824 invert the low logic level of the GCLK signal to produce the PORSW signal at a high logic level. The PORSW signal being at a high logic level enables FET $M_{N10}$ for conduction. Also, the GCLK signal being at a low logic level also causes the read/write cycle reset timer 480 or 700 to cause the RESET signal to be at a high logic level. Through the even number of inverters 812 (e.g., four (4)) of the delay circuit 810, the high logic level of the RESET signal is applied to the gates of FETs $M_{P10}$ and $M_{N9}$. This causes the FET $M_{P10}$ to not conduct, and the FET $M_{N9}$ to conduct. Thus, by way of conducting FETs $M_{N9}$ and $M_{N10}$, the input to the inverter 814 is responsive to the input of inverter 816, which is coupled to the drains of the FETs $M_{N11}$ responsive to the predecoded bit lines $b_1$ to $b_2n$.

Thus, if one or more of the predecoded bit lines $b_1$ to $b_2n$ are activated (at a high logic level), the voltage at the input to the inverter 816 will be at a low logic level. By way of the cascaded inverters 816 and 818 and the conducting FETs $M_{N10}$ and $M_{N9}$, the low logic level is applied to the input of the inverter 814. This causes the inverter 814 to generate the POR signal at a high logic level. The POR signal being at a high logic level causes the read/write cycle reset timer 480 or 700 to generate or assert the RESET signal by bringing it to a low logic level. As previously discussed, the asserted RESET signal deactivates any activated predecoded bit lines $b_1$ to $b_2n$ to prevent undesirable high currents from being produced in the memory array 420, and to configure the memory array 420 for normal intended operations.

After a defined delay resulting from the even number of cascaded inverters 812 of the delay circuit 810, the asserted or low logic level of the RESET signal is applied to the gates of $M_{P10}$ and $M_{N9}$. This causes $M_{P10}$ to conduct and $M_{N9}$ to not conduct. As a result, the conducting $M_{P10}$ applies $V_{DD}$ or a high logic level to the input of the inverter 814. In response, the inverter 814 de-asserts the POR signal by bringing it to a low logic level. The FET $M_{P11}$ and the inverter 814 operate as a latch to maintain the POR signal de-asserted during read/write operations of the memory circuit 400. The asserted or low logic level of the RESET signal is also applied to the gates of FETs $M_{P7}$ and $M_{P8}$ by way of even number of inverters 812 (e.g., six (6)) from the input of the delay circuit 810. The low logic level at the gates of FETs $M_{P7}$ and $M_{P8}$ causes these devices to conduct. As a consequence, $V_{DD}$ or a high logic level is applied to the input of inverter 816.

This causes the latch configuration of inverter 816 and FET $M_{P9}$ to generate a low logic signal at the output of inverter 816. In response, the inverter 818 outputs a high logic level to prevent FET $M_{N10}$ from conducting. The POR signal is maintained de-asserted during read/write cycle operation because the PORSW signal is substantially 180 degrees out-of-phase with the asserted predecoded bit lines $b_i$. Thus, the gate-to-source voltage ($V_{GS}$) of FET $M_{N10}$ is substantially at zero (0) Volt, and thus keeps FET $M_{N10}$ from conducting. This prevents the triggering of the latch configuration of inverter 814 and FET $M_{P11}$ to maintain the POR signal de-asserted during read/write cycle operations.

Figure 9:
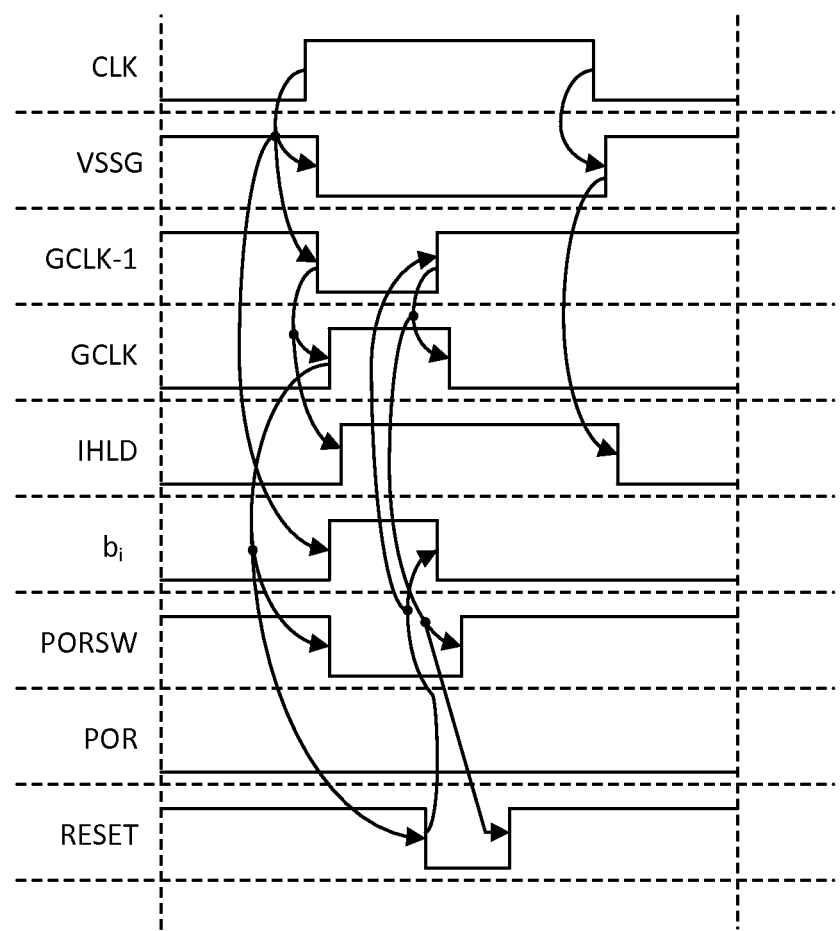
FIG. 9 illustrates a timing diagram of exemplary signals associated with a read/write cycle operation in accordance with another aspect of the disclosure.

FIG. 9 illustrates a timing diagram of exemplary signals associated with a read/write cycle operation of the memory circuit 400 in accordance with another aspect of the disclosure. According to the timing diagram, a read or write cycle begins with the CLK signal transitioning from a low logic level to a high logic level. With further reference to FIGS. 5-6, this causes FET $M_{N2}$ of the predecoder circuit 500 and FET $M_{N4}$ of the predecoder replica block 600 to conduct. This also causes FET $M_{P3}$ to not conduct, thereby allowing VSSG to transition from a high logic level to a low logic level. During this transition, the IHLD signal is at a low logic level. This allows the asserted pre-latch predecoded address bit to be applied to the gate of FET $M_{N1}$ of the predecoder circuit 500 and the CS signal to be applied to the FET $M_{N3}$ of the predecoder replica block 600. Thus, both FETs $M_{N1}$ and $M_{N3}$ are turned on. Since both FETs $M_{N1}$ and $M_{N2}$ of the predecoder circuit 500 are conducting, ground potential is applied to the latch 508, thereby causing the latch 508 to output a low logic level. The inverter 510 inverts the low logic level at its input in order to assert the predecoded address bit $b_i$ for the purpose of accessing the one or more memory cells of the memory array 420 that are associated with the asserted predecoded address bit $b_i$.

Similarly, since both $M_{N3}$ and $M_{N4}$ of the predecoder replica block 600 are conducting, ground potential is applied to the latch 608, thereby causing the latch 608 to output the GCLK-1 signal at a low logic level. The inverter 610 inverts the low logic level at its input in order to cause a low-to-high logic level transition of the GCLK signal. As previously discussed, the low-to-high logic level transition of the GCLK signal initiates the generation or assertion of the RESET signal by the read/write cycle reset timer 480 or 700 a defined time interval later. This time interval is provided to allow access to the one or more memory cells of the memory array 420 that are associated with the asserted predecoded address line $b_i$.

The GCLK-1 signal being at a low logic level causes FET $M_{P4}$ to conduct and FET $M_{N5}$ to not conduct. The conducting FET $M_{P4}$ applies $V_{DD}$ to the latch 612, thereby causing the latch 612 to produce a high logic level. In response, this inverter 616 causes the IHLD signal to transition from the low logic level to a high logic level through the effects of the cascaded inverters 614 and 616. The IHLD signal being at the high logic level de-couples the asserted predecoded bit $b_i$ from the gate of the FET $M_{N1}$ of the predecoder circuit 500, and decouples the asserted CS signal from the gate of the FET $M_{N3}$ of the predecoder replica block 600. This causes both FETs $M_{N1}$ and $M_{N3}$ to not conduct and prevents a short circuit between $V_{DD}$ and ground from occurring when the RESET signal is subsequently asserted.

When the read/write cycle reset timer 480 generates or asserts the RESET signal a defined time interval after the GCLK signal transitions to the high logic level, the asserted RESET signal being at a low logic level causes FET $M_{P1}$ of the predecoder circuit 500 and FET $M_{P2}$ of the predecoder replica block 600 to conduct. This applies $V_{DD}$ to the latches 508 and 608, thereby causing the latches 508 and 608 to generate a high logic level. The inverter 510 of the predecoder circuit 500 de-asserts the previously-asserted predecoder address bit line $b_i$ to configure the address predecoder 410 for the next read/write cycle. The inverter 610 of the predecoder replica block 600 causes the GCLK signal to transition to a low logic level, which will cause the read/write cycle reset timer 480 or 700 to de-assert the RESET signal.

At approximately the end of the read/write cycle, the CLK signal transitions to a low logic level, thereby causing FETs $M_{N2}$ of the predecoder circuit 500 and FET $M_{N4}$ of the predecoder replica block 600 to not conduct. The CLK signal also being not at the low logic level causes FET $M_{P3}$ of the predecoder replica block 600 to conduct, thereby bringing the VSSG signal to a high logic level. The VSSG signal transitioning to a high logic level causes FET $M_{N6}$ to conduct, thereby applying ground potential to the latch 612. The latch 612, in turn, changes state to produce a low logic level at the input of inverter 612. The cascaded inverters 614 and 616, in turn, cause the IHLD signal to transition to a low logic level for the next read/write cycle.

As noted in the timing diagram, the POR signal remains de-asserted at a low logic level. This is because, as previously discussed, the asserted predecoded bit line $b_i$ and the PORSW signal are substantially 180 degrees out-of-phase, as shown. This causes the gate-to-source voltage of FET $M_{N10}$ of the power-on-reset circuit 800 to be maintained at substantially zero (0) Volt to keep FET $M_{N10}$ from conducting. This prevents the latch configuration of inverter 814 and FET $M_{P11}$ from changing state in order to maintain the POR signal de-asserted during read/write operations.

Figure 10:
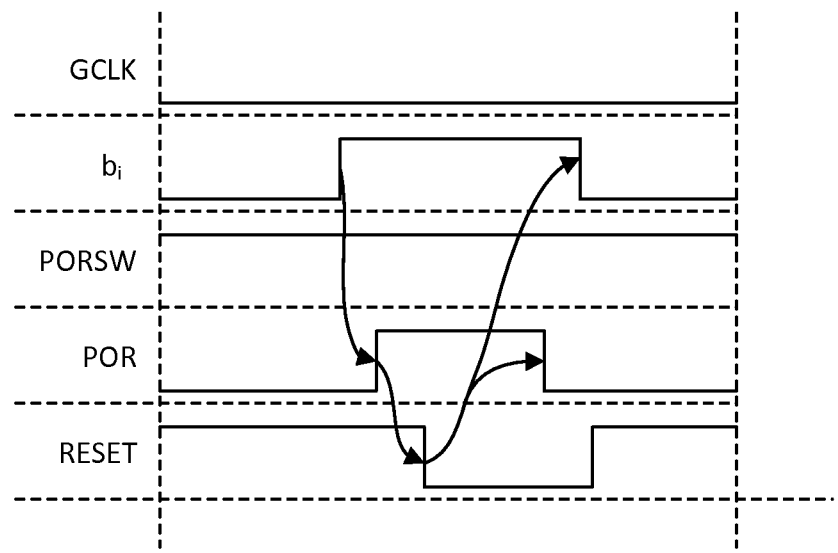
FIG. 10 illustrates a timing diagram of exemplary signals associated with a power-on-reset operation in accordance with another aspect of the disclosure.

FIG. 10 illustrates a timing diagram of exemplary signals associated with a power-on-reset operation in accordance with another aspect of the disclosure. With further reference to FIG. 8, when the PORSW signal is at a high logic level due to, for example, the GCLK signal settling initially at a low logic level upon powering on of the memory circuit 400, the FET $M_{N10}$ conducts if one or more of the predecoded address lines $b_1$ to $b_2n$ are asserted. This is because if one or more of the predecoded address lines $b_1$ to $b_2n$ are asserted, one or more of the FETs $M_{N11}$ are conducting, causing the input to the inverter 816 to be at a low logic level. This low logic level is provided to the source of FET $M_{N10}$ by way of cascaded inverters 816 and 818. Because the PORSW signal at the gate of FET $M_{N10}$ is at a high logic level, the FET $M_{N10}$ conducts.

Also because the GCLK signal settles initially to a low logic level, the RESET signal is initially at a high logic level. The high logic level of the RESET signal is produced at the gates of FETs $M_{P10}$ and $M_{N9}$ by way of the even number of inverters 812 of the delay circuit 810. This high logic level causes FETs $M_{P10}$ to not conduct and FET $M_{N9}$ to conduct. Because FETs $M_{N10}$ and $M_{N9}$ are conducting, the low logic level generated at the input of inverter 816 due to one or more of the predecoded address lines $b_1$ to $b_2n$ being asserted, is applied to the latch configuration of inverter 814 and FET $M_{P11}$. This causes the POR signal to be asserted at a high logic level. The read/write cycle reset timer 700 asserts the RESET signal at a low logic level in response to the POR signal being asserted. The asserted RESET signal causes the address predecoder 410 to de-assert any asserted predecoded bit lines $b_1$ to $b_2n$ to prevent high currents from being generated in the memory array 420, and configure the memory array 420 for normal intended operations. The asserted RESET signal, by way of the inverters 812 of the delay circuit 810 of the power-on-reset circuit 800, also causes the latch configuration of inverter 814 and FET $M_{P11}$ to de-assert the POR signal.

Figure 11:
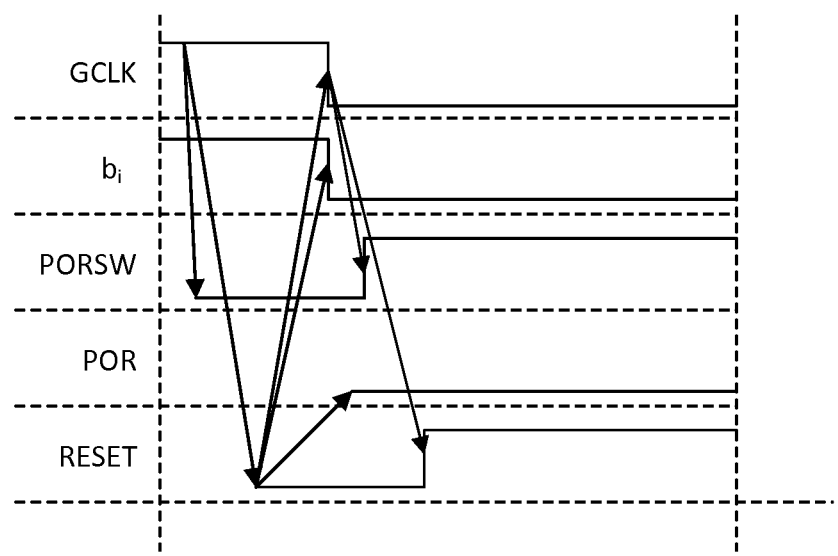
FIG. 11 illustrates a timing diagram of exemplary signals associated with a power on operation in accordance with another aspect of the disclosure.

FIG. 11 illustrates a timing diagram of exemplary signals associated with a power on operation in accordance with another aspect of the disclosure. Note that in this case, the GCLK signal initially settles to a high logic level upon powering on of the memory circuit 400. In this case, the POR signal is not generated since the GCLK signal being at the high logic level causes the RESET signal to be asserted. This, as previously discussed, de-asserts any asserted predecoded address lines during power on operations. Thus, it does not matter whether the GCLK signal is initially at a low or high logic level; the RESET signal will be asserted. As discussed above, if the GCLK signal is at a low logic level, the power-on-reset circuit 800 will generate or assert the POR signal, which causes the read/write cycle reset timer 700 to assert the RESET signal. If, on the other hand, the GCLK signal is at a high logic level, the read/write cycle reset timer 700 asserts the RESET signal due to the resulting conduction of FETs $M_{N7}$ and $M_{N8}$.

Figure 12:
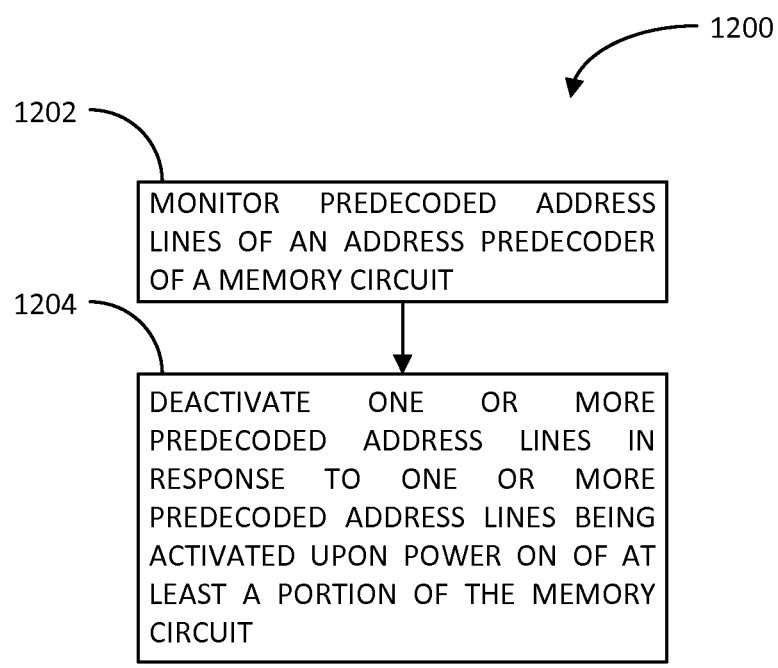
FIG. 12 illustrates a flow diagram of an exemplary method of controlling a memory circuit in accordance with another aspect of the disclosure.

FIG. 12 illustrates a flow diagram of an exemplary method 1200 of controlling a memory circuit in accordance with another aspect of the disclosure. According to the method 1200, predecoded address lines of an address predecoder of the memory circuit are monitored (block 1202). As previously discussed, the address predecoder is configured to activate one or more of the predecoded address lines based on an input address. Additionally, as previously discussed, the predecoded address lines are coupled to a memory device for accessing one or more memory cells associated with the one or more activated predecoded address lines. Then, according to the method 1200, one or more predecoded address lines are deactivated in response to the one or more predecoded address lines being activated upon powering on of at least a portion of the memory circuit (block 1204). The deactivation of any activated predecoded address lines configures the memory circuit for normal operations.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using another structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Also, it should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise a set of elements comprises one or more elements. In addition, terminology of the form "at least one of A, B, or C" or "one or more of A, B, or C" or "at least one of the group consisting of A, B, and C" used in the description or the claims means "A or B or C or any combination of these elements."

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

Those of skill in the art understand that information and signals may be represented using any of a variety of different technologies and techniques. For example, any data, instructions, commands, information, signals, bits, symbols, and chips referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the wireless node, all which may be accessed by the processor through the bus interface. Alternatively, or in addition, the machine-readable media, or any portion thereof, may be integrated into the processor, such as the case may be with cache and/or general register files.

A processing system may include hardware, software, firmware or any combination thereof. The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. In some aspects, a computer-readable medium comprises codes executable to perform one or more operations as taught herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the scope of the disclosure. Thus, the present disclosure is not intended to be limited to the aspects shown herein but is to be accorded the widest scope consistent with the principles and novel features disclosed herein.

What is claimed is:

1. An apparatus, comprising:
a memory device;
an address predecoder configured to activate one or more of a plurality of predecoded address lines based on an input address, wherein the plurality of predecoded address lines are coupled to the memory device for accessing one or more memory cells associated with the one or more activated predecoded address lines; and
a power-on-reset circuit configured to deactivate one or more of the predecoded address lines in response to the one or more of the predecoded address lines being activated upon powering on of at least a portion of the apparatus.

2. The apparatus of claim 1, wherein the power-on-reset circuit is configured to generate a reset signal to cause the address predecoder to deactivate the one or more activated predecoded address lines upon powering on the at least portion of the apparatus.

3. The apparatus of claim 1, wherein the power-on-reset circuit is configured to initiate a generation of a reset signal to cause the address predecoder to deactivate the one or more activated predecoded address lines upon powering on the at least portion of the apparatus.

4. The apparatus of claim 1, wherein the memory device comprises a plurality of memory arrays, wherein a first set of one or more of the predecoded address lines is configured for selecting one or more of the memory arrays, and wherein a second set of predecoded address lines is configured for selecting one or more word lines of the selected one or more memory arrays.

5. The apparatus of claim 4, wherein the power-on-reset circuit is configured to deactivate one or more of the predecoded address lines in response to one or more of the predecoded address lines of the first set being activated upon powering on the at least portion of the apparatus, and not deactivate one or more of the predecoded address lines in response to one or more of the predecoded address lines of the second set being activated upon powering on the at least portion of the apparatus.

6. The apparatus of claim 1, further comprising a read/write cycle reset timer configured to deactivate one or more of the predecoded address lines during each read or write cycle operation performed on the memory device.

7. The apparatus of claim 6, wherein the power-on-reset circuit is configured to initiate the read/write cycle reset timer to deactivate one or more predecoded address lines in response to the one or more of the predecoded address lines being activated upon powering on the at least portion of the apparatus.

8. A method of controlling a memory circuit, comprising:
monitoring predecoded address lines of an address predecoder configured to activate one or more of a plurality of predecoded address lines based on an input address, wherein the plurality of predecoded address lines are coupled to a memory device for accessing one or more memory cells associated with the one or more activated predecoded address lines; and
deactivating one or more of the predecoded address lines activated in response to the one or more of the predecoded address lines being activated upon powering on of at least a portion of the memory circuit.

9. The method of claim 8, wherein deactivating the one or more activated predecoded address lines comprises generating a reset signal configured to deactivate the one or more activated predecoded address lines in response to the one or more of the predecoded address lines being activated upon powering on the at portion of the memory circuit.

10. The method of claim 8, wherein deactivating the one or more activated predecoded address lines comprises initiating a generation of a reset signal configured to deactivate the one or more activated predecoded address lines in response to the one or more of the predecoded address lines being activated upon powering on the at least portion of the memory circuit.

11. The method of claim 8, wherein the memory device comprises a plurality of memory arrays, wherein a first set of one or more of the predecoded address lines is configured for selecting one or more of the memory arrays, and wherein a second set of predecoded address lines is configured for selecting one or more word lines of the selected one or more memory arrays.

12. The method of claim 11, wherein deactivating the one or more activated predecoded address lines comprises deactivating one or more of the predecoded address lines in response to the one or more of the predecoded address lines of the first set being activated upon powering on the at least portion of the memory circuit, and not deactivating one or more of the predecoded address lines in response to one or more of the predecoded address lines of the second set being activated upon powering on of the at least portion of the memory circuit.

13. The method of claim 8, further comprising generating a reset signal configured to deactivate one or more of the predecoded address lines during each read or write cycle operation performed on the memory device.

14. The method of claim 13, wherein deactivating the one or more of the predecoded address lines comprises initiating the generation of the reset signal to deactivate one or more predecoded lines in response to the one or more of the predecoded address lines being activated upon powering on the at least portion of the memory circuit.

15. An apparatus, comprising:
means for monitoring predecoded address lines of an address predecoder configured to activate one or more of a plurality of predecoded address lines based on an input address, wherein the plurality of predecoded address lines are coupled to a memory device for accessing one or more memory cells associated with the one or more activated predecoded address lines; and
means for deactivating one or more of the predecoded address lines activated in response to the application of power to at least a portion of the apparatus, wherein the means for deactivating is configured to deactivate the one or more activated predecoded address lines by generating a reset signal configured to deactivate the one or more activated predecoded address lines in response to the application of power to the at least portion of the apparatus.

16. An apparatus, comprising:
means for monitoring predecoded address lines of an address predecoder configured to activate one or more of a plurality of predecoded address lines based on an input address, wherein the plurality of predecoded address lines are coupled to a memory device for accessing one or more memory cells associated with the one or more activated predecoded address lines; and
means for deactivating one or more of the predecoded address lines activated in response to the application of power to at least a portion of the apparatus, wherein the means for deactivating is configured to deactivate the one or more activated predecoded address lines by initiating a generation of a reset signal configured to deactivate the one or more activated predecoded address lines in response to the application of power to the at least portion of the apparatus.

17. The apparatus of claim 15, wherein the memory device comprises a plurality of memory arrays, wherein a first set of one or more of the predecoded address lines is configured for selecting one or more of the memory arrays, and wherein a second set of predecoded address lines is configured for selecting one or more word lines of the selected one or more memory arrays.

18. The apparatus of claim 17, wherein the means for deactivating is configured to deactivate the one or more activated predecoded address lines by deactivating one or more of the predecoded address lines in response to one or more of the predecoded address lines of the first set being activated upon the application of power to the at least portion of the apparatus, and not deactivating one or more of the predecoded address lines in response to one or more of the predecoded address lines of the second set being activated upon the application of power to the at least portion of the apparatus.

19. The apparatus of claim 15, further comprising means for generating a reset signal configured to deactivate one or more predecoded address lines during each read or write cycle operation performed on the memory device.

20. The apparatus of claim 19, wherein the means for deactivating the one or more of the predecoded address lines is configured to initiate the generation of the reset signal by the reset signal generating means to deactivate the one or more predecoded lines in response to the one or more of the predecoded address lines being activated upon the application of power to the at least portion of the apparatus.

* * * * *